(12) United States Patent
Kumar (10) Patent No.: US 7,525,385 B2
(45) Date of Patent: Apr. 28, 2009

(54) COMMON DRAIN DRIVEN CASCODE ENHANCEMENT MODE TRAVELING WAVE AMPLIFIER

(75) Inventor: Sushil Kumar, Fremont, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 121 days.

(21) Appl. No.: 11/589,177

(22) Filed: Oct. 30, 2006

(65) Prior Publication Data

US 2008/0100381 A1    May 1, 2008

(51) Int. Cl.
*H03F 3/68* (2006.01)

(52) U.S. Cl. .............................. 330/295; 330/54; 330/43

(58) Field of Classification Search ................. 330/295, 330/54, 43
See application file for complete search history.

(56) References Cited

U.S. PATENT DOCUMENTS

| | | | | |
|---|---|---|---|---|
| 5,559,472 | A * | 9/1996 | Kobayashi | 330/293 |
| 5,880,640 | A * | 3/1999 | Dueme | 330/303 |
| 6,768,380 | B2 * | 7/2004 | Hong et al. | 330/286 |
| 6,794,934 | B2 * | 9/2004 | Betti-Berutto et al. | 330/124 R |
| 6,806,778 | B1 * | 10/2004 | Kobayashi | 330/311 |
| 7,132,894 | B2 * | 11/2006 | Shapiro et al. | 330/308 |

\* cited by examiner

*Primary Examiner*—Patricia Nguyen (57) ABSTRACT

A traveling wave amplifier includes a synthetic gate line, a synthetic drain line and a plurality of common drain driven cascode transistor circuits each connected between the synthetic gate line and the synthetic drain line.

11 Claims, 7 Drawing Sheets

COMMON DRAIN DRIVEN CASCODE ENHANCEMENT MODE TRAVELING WAVE AMPLIFIER

BACKGROUND

Traveling wave amplifiers (TWA) are commonly employed for amplification of signals in ultra-wideband applications. The bandwidth of a TWA may start from almost DC (e.g., a few kilohertz) and extend up to microwave frequencies and even millimeter-wave frequencies.

Figure 1:
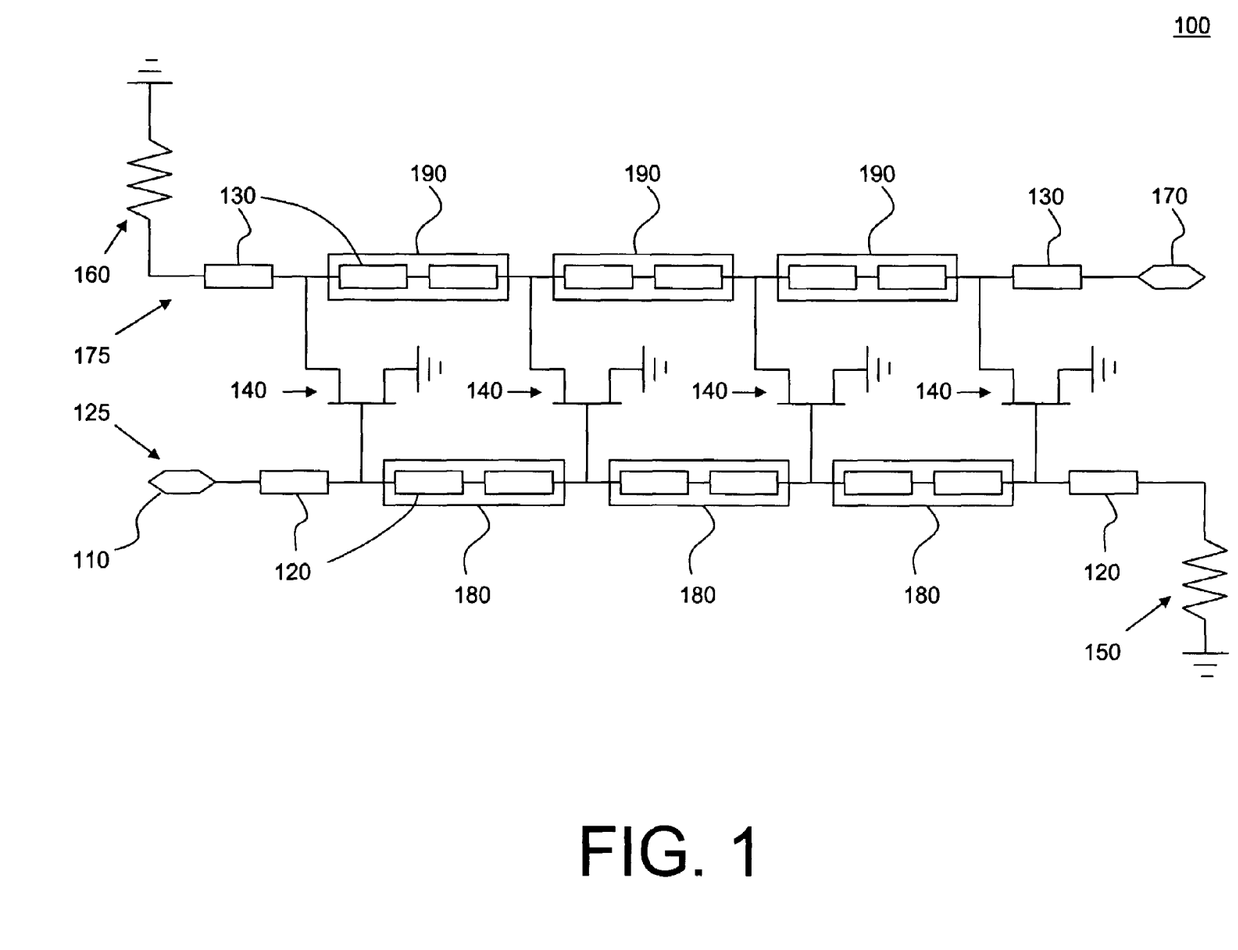
FIG. 1 shows a simplified schematic diagram of a four-section traveling wave amplifier (TWA).

FIG. 1 shows a simplified schematic diagram of one typical four-section TWA 100. TWA 100 includes an input port 110, a plurality of first inductance elements 120, a plurality of second inductance elements 130, a plurality of transistors 140, a first load 150, a second load 160, and an output port 170. As shown in FIG. 1, pairs of first inductance elements 120 may be combined into third inductance elements 180, and pairs of second inductance elements 130 may be combined into fourth inductance elements 190. In that case, third inductance elements 180 each have an inductance that is twice the inductance of each first inductance element 120, and fourth inductance elements 190 each have an inductance that is twice the inductance of each second inductance element 130. Other elements such as blocking capacitors, power supply voltages, bias voltage connections, etc. are omitted from the simplified schematic diagram of FIG. 1 for ease of illustration.

In TWA 100, first and third inductance elements 120 and 180 form a synthetic gate line 125 between input port 110 and first load 150. Similarly, second and fourth inductance elements 130 and 190 form a synthetic drain line 175 between second load 160 and output port 170. Meanwhile, transistors 140 are connected between synthetic gate line 125 and synthetic drain line 175, with a gate of each transistor 140 connected between adjacent first inductance elements 120 of synthetic gate line 125, a drain of each transistor 140 connected between adjacent second inductance elements 130 of synthetic drain line 175, and a source of each transistor 140 connected to ground.

Figure 2:
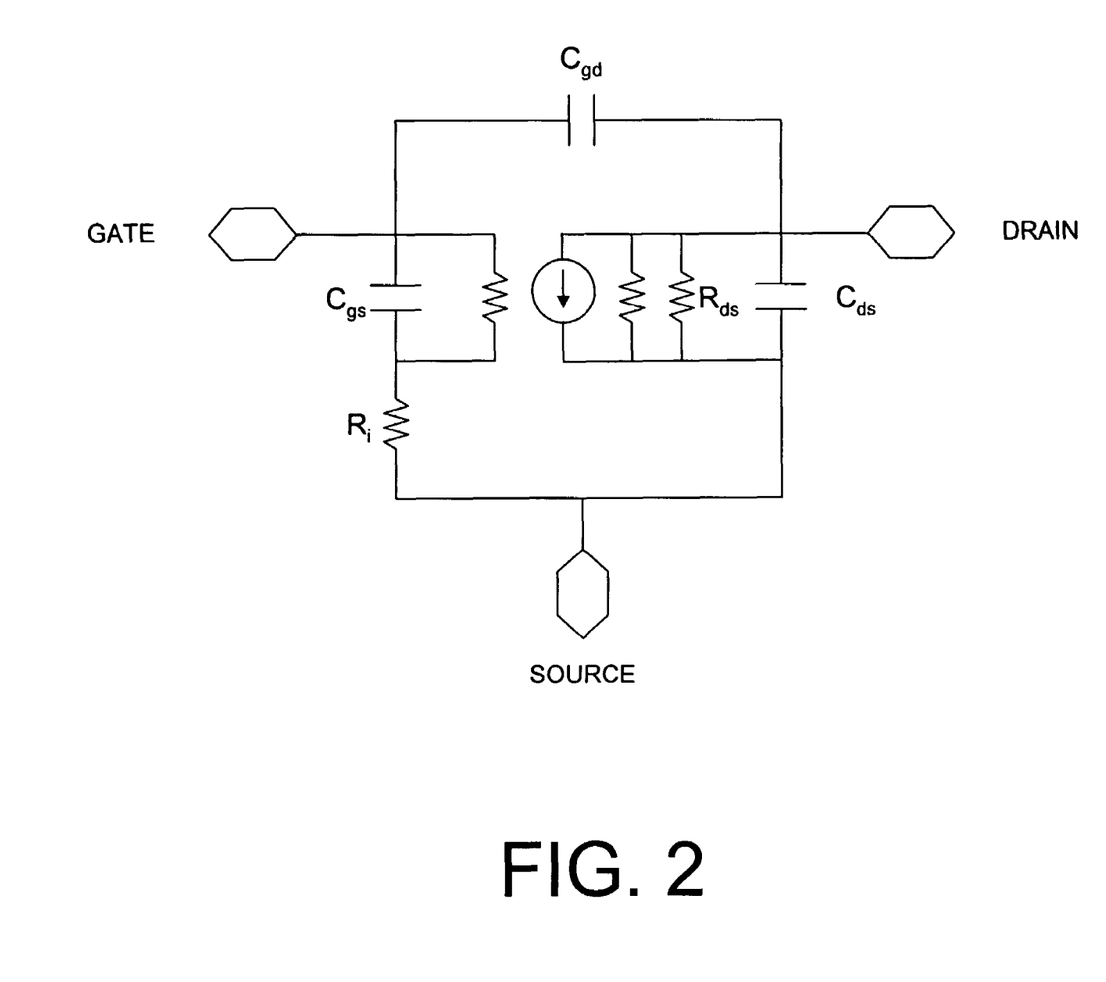
FIG. 2 shows an equivalent circuit of a field effect transistor (FET).
Figure 3:
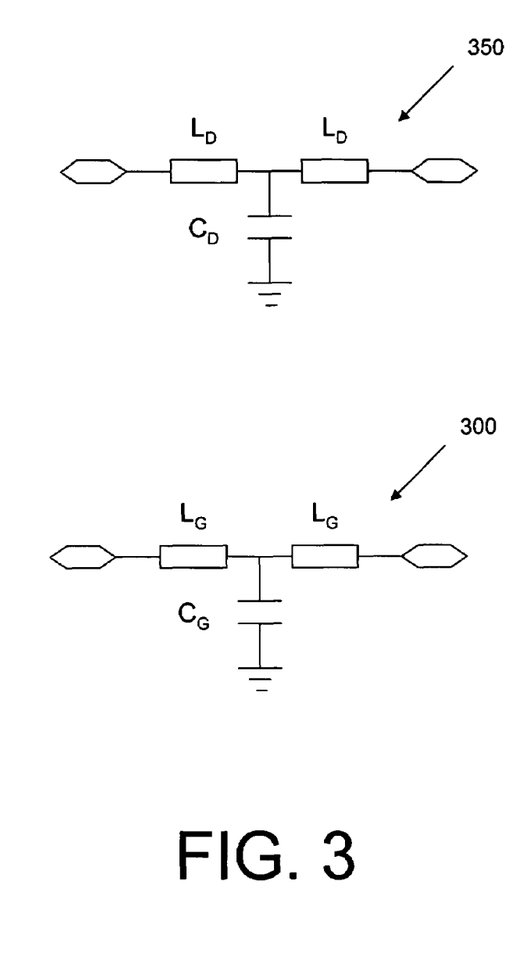
FIG. 3 shows artificial transmission lines of the TWA of FIG. 1.

To better understand the operating principles of TWA 100, FIG. 2 shows an equivalent circuit of each transistor 140. With the source grounded, in an ideal (lossless case), it can be seen that there is a first capacitance $C_{gs}$ between the gate and ground, and a second capacitance, $C_{ds}$ between the drain and ground. In that case, TWA 100 can be modeled as including an artificial gate transmission line 300 and an artificial drain transmission line 350 as shown in FIG. 3. Artificial gate transmission line 300 has a characteristic impedance:

(1) $Z_O=(L_G/C_G)^{1/2}$, where $L_G$ is the inductance of third inductance element 180 and $C_G$ is the combination of the gate capacitance $C_{gs}$ and the parasitic capacitance of third inductance element 180. Similarly, artificial drain transmission line 350 has a characteristic impedance:

(2) $Z_O=(L_D/C_D)^{1/2}$, where $L_D$ is the inductance of fourth inductance element 190 and $C_D$ is the combination of the drain capacitance $C_{ds}$ and the parasitic capacitance of fourth inductance element 190.

Given n stages, the gain of TWA 100 is:

(3) $Gain=(n^2*gm*Z_O^2)/4$, where gm is the transconductance gain of transistor 140.

Furthermore, the cutoff frequency, Fc(gate), of artificial gate transmission line 300 is:

$$Fc(gate)=2/(L_G*C_G)^{1/2}. \quad (4)$$

and the cutoff frequency, Fc(drain), of artificial drain transmission line 350 is:

$$Fc(drain)=2/(L_D*C_D)^{1/2}. \quad (5)$$

In general, $C_{gs}\gg C_{ds}$, and therefore $C_G\gg C_D$. So, from equations (4) and (5), we can see that the upper cutoff frequency of TWA 100 is set by $C_G$. That is, as $C_G$ increases, the upper cutoff frequency (bandwidth) of TWA 100 decreases, and vice versa.

So, to increase the bandwidth of TWA 100, it becomes necessary to reduce $C_G$. This can be accomplished by using transistors 140 having smaller gate widths, reducing $C_{gs}$ and thereby $C_G$. However, in general transistors having a smaller gate width also have a reduced gain and reduced power-handling capacity. Accordingly, in general, to increase the bandwidth of TWA 100, gain and power output capabilities of TWA 100 must be sacrificed. This is undesirable, and unacceptable in some applications.

To increase the bandwidth of a TWA, several alternative TWA configurations have been proposed.

Figure 4:
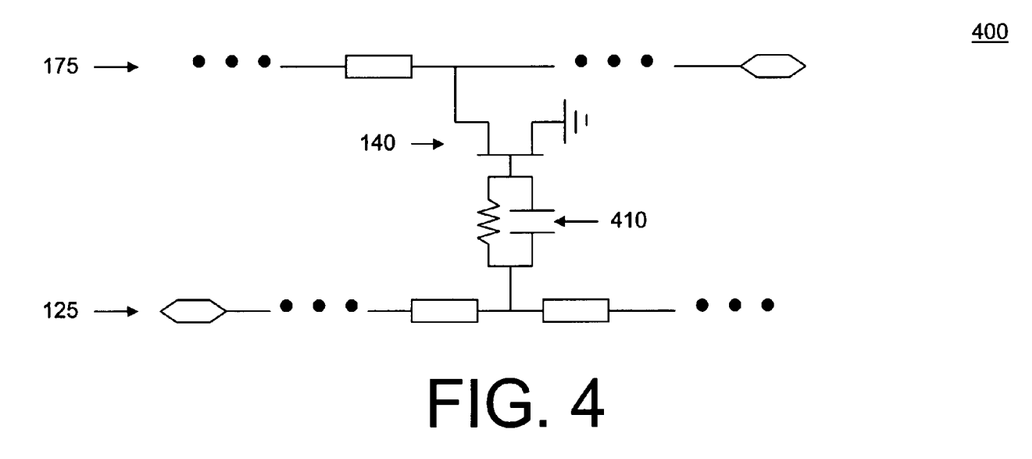
FIG. 4 shows a simplified schematic diagram of a portion of an alternative TWA.

FIG. 4 shows a simplified schematic diagram of a portion of an alternative TWA 400. TWA 400 includes a parallel resistor/capacitor (RC) circuit 410 disposed between the gate of each transistor 140 and the synthetic gate line 125. The construction and operation of TWA 400 is the same as TWA 100 other than the parallel RC circuit 410, so for clarity of explanation, a description of the remaining elements and the operation will not be repeated, and only the differences between TWA 400 and TWA 100 will be described.

The addition of parallel RC circuit 410 in series with the gate-source capacitance Cgs of transistor 140, reduces the capacitance $C_G$ of the artificial gate transmission line of TWA 400 compared to the TWA 100 of FIG. 1. Therefore, the cutoff frequency Fc(gate) of the artificial gate transmission line TWA 400 is increased with respect to TWA 100. Accordingly, all other things being equal, the bandwidth of TWA 400 is increased compared to TWA 100.

Figure 5:
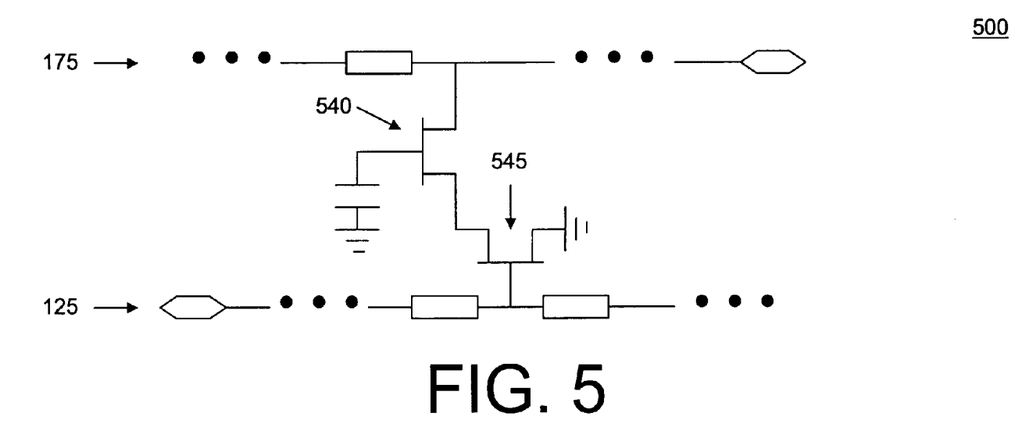
FIG. 5 shows a simplified schematic diagram of a portion of another alternative TWA.

FIG. 5 shows a simplified schematic diagram of a portion of an alternative TWA 500. TWA 500 includes cascode transistors 540 and 545 connected between synthetic gate line 125 and synthetic drain line 175 in place of transistor 140 of TWA 100. The construction and operation of TWA 500 is the same as TWA 100 other than the substitution of cascode transistors 540 and 545 in TWA 500 for the single transistor 140 in TWA 100, so for clarity of explanation, a description of the remaining elements and the operation will not be repeated, and only the differences between TWA 500 and TWA 100 will be described.

The cascode transistors 540 and 545 present a reduced capacitance to synthetic gate line 125 compared to transistor 140 in FIG. 1. As a result, the capacitance $C_G$ of the artificial gate transmission line of TWA 500 is reduced compared to TWA 100 of FIG. 1. Therefore, the cutoff frequency Fc(gate) of the artificial gate transmission line of TWA 500 is increased with respect to TWA 100. Accordingly, all other things being equal, the bandwidth of TWA 500 is increased compared to TWA 100. Furthermore, the effective output impedance of the cascode transistors 540 and 545 as seen by synthetic drain line 175 is increased compared to TWA 100.

Figure 6:
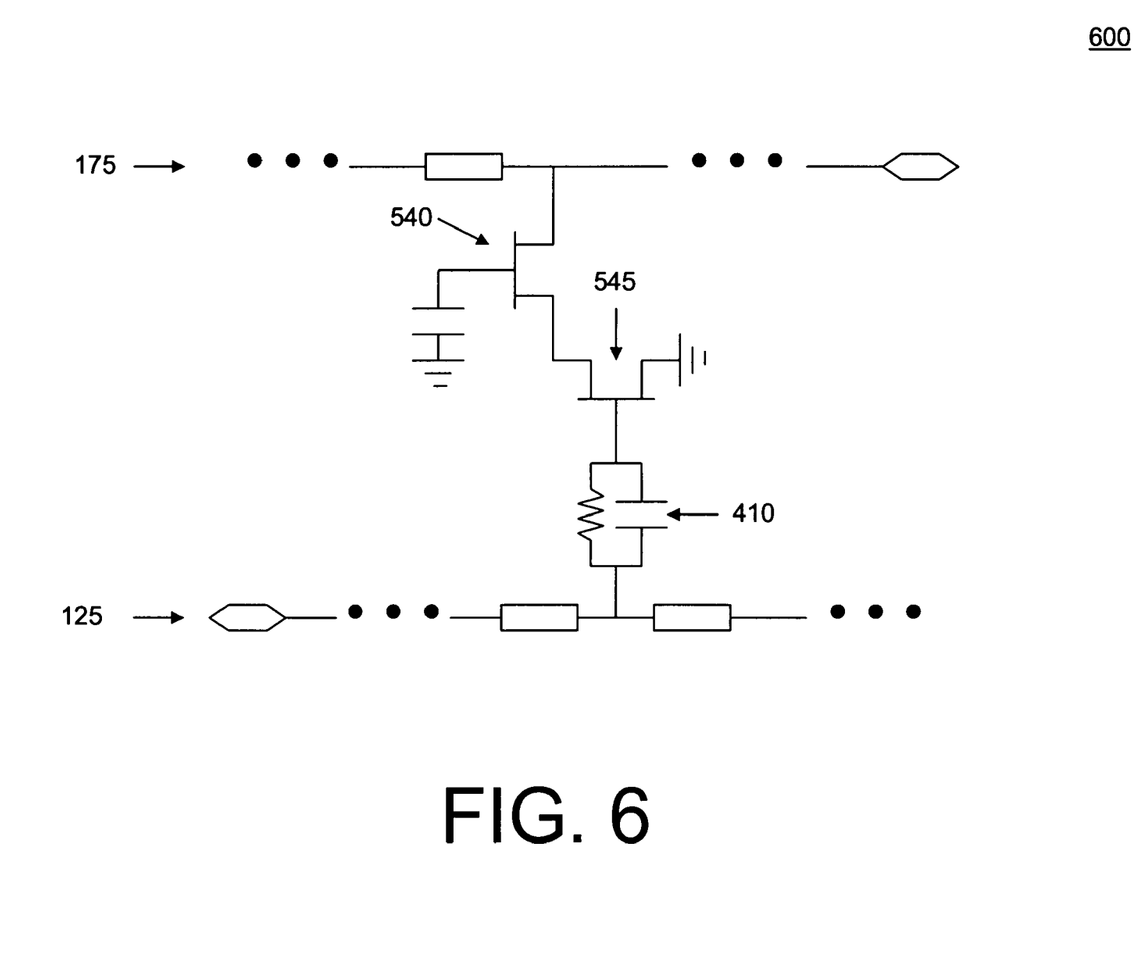
FIG. 6 shows a simplified schematic diagram of a portion of yet another alternative TWA.

FIG. 6 shows a simplified schematic diagram of a portion of yet another alternative TWA 600. TWA 600 represents a sort of combination of the features of TWA 400 and TWA 500. More specifically, TWA 600 includes the cascode transistors 540 and 545 of TWA 500, and the RC circuit 410 of TWA 400. By adding RC circuit 410 to the cascode transistor arrangement of FIG. 5, the bandwidth of TWA 600 can be increased compared to the bandwidth of TWA 500.

However, the above-described TWA configurations of FIGS. 4-6 have certain shortcomings. For example, all other things being equal, in general TWA 400 suffers from a reduced gain across the band compared to TWA 100. Furthermore, gain compensation at the lower end of the frequency band is difficult in TWA 400. Meanwhile, TWA 500 can extend the bandwidth somewhat compared to TWA 100, but it is still not enough for many applications. Also, TWA 500 is quite prone to oscillation. The bandwidth of TWA 500 can be extended further by adding the RC circuit 410 of TWA 400, as shown by TWA 600, but this presents the same disadvantages of TWA 400—namely, the gain is reduced across the band, and gain compensation at the lower end of the frequency band becomes more difficult.

What is needed, therefore, is a traveling wave amplifier which can provide increased bandwidth, with a higher gain, greater power handling capability, and adequate stability.

SUMMARY

In an example embodiment, a traveling wave amplifier comprises an input port adapted to receive a signal to be amplified; an output port adapted to output an amplified signal; and a plurality of stages provided between the input port and the output port. Each stage includes: an input path including a first input path terminal and a second input path terminal; an output path including a first output path terminal and a second output path terminal; a first field effect transistor having a gate connected to the input path between the first input path terminal and the second input path terminal, a drain connected to a supply voltage, and a source; a second field effect transistor having a gate connected to the source of the first transistor, a source connected to a second supply voltage, and a drain; and a third field effect transistor having a gate connected to a bias voltage, a source connected to the drain of the second transistor, and a drain connected to the output path between the first output path terminal and the second output path terminal.

In another example embodiment, a traveling wave amplifier comprises: an input port adapted to receive a signal to be amplified; an output port adapted to output an amplified signal; an input termination; an output termination; a synthetic gate line extending between the input port and the input termination; a synthetic drain line extending between the output termination and the output port; and a plurality of common drain driven cascode transistor circuits. Each common drain driven cascode transistor circuit comprises: a first transistor having a gate connected to the synthetic gate line, a drain connected to a supply voltage, and a source; a second transistor having a gate connected to the source of the first transistor, a source connected to a second supply voltage, and a drain; and a third transistor having a gate connected to a bias voltage, a source connected to the drain of the second transistor, and a drain connected to the synthetic drain line.

In yet another example embodiment, a traveling wave amplifier comprises a synthetic gate line, a synthetic drain line and a plurality of common drain driven cascode transistor circuits each connected between the synthetic gate line and the synthetic drain line.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

In the description to follow, when it is said that two or more components or points are connected to each other, it should be understood that does not preclude the possibility of the existence of intervening elements or components. In contrast, when it is said that two or more components or points are directly connected to each other, it should be understood that the two components or points are connected without any intervening components or circuits that significantly affect a signal passed across the connection. However a conductive contact, wire, or line which does not present substantial capacitance, inductance, or resistance at frequencies of interest may be used to directly connect the two or more components or points. Also, as used herein, a "line" means something that is distinct, elongated, and relatively narrow. It can be curved, straight, or bent unless otherwise indicated. It is not to be construed in a strict mathematical sense as having no width, or as being generated by a moving point, unless otherwise specifically indicated.

Figure 7:
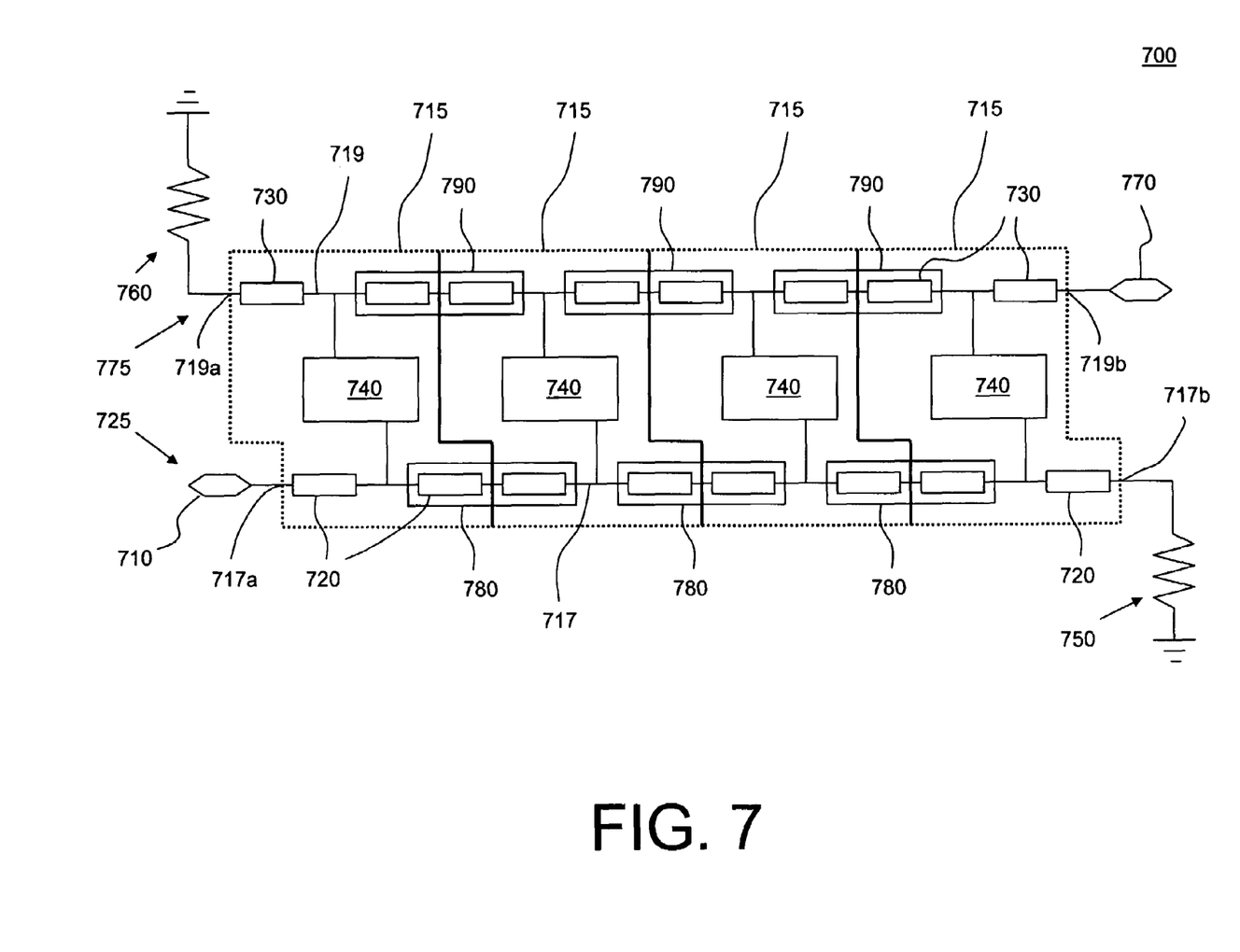
FIG. 7 shows a simplified schematic of one embodiment of a common drain driven cascode enhancement mode traveling wave amplifier.

FIG. 7 shows a simplified schematic of one embodiment of a common drain driven cascode enhancement mode traveling wave amplifier. TWA 700 includes an input port 710, a plurality of first inductance elements 720, a plurality of second inductance elements 730, a plurality of common drain driven cascode transistor circuits 740, an input termination 750, an output termination 760, and an output port 770. Input port 710 is adapted to receive a signal to be amplified, and output port 770 is adapted to output an amplified output signal. As shown in FIG. 7, pairs of first inductance elements 720 may be combined into third inductance elements 780, and pairs of second inductance elements 730 may be combined into fourth inductance elements 790. In that case, third inductance elements 780 each have an inductance that is twice the inductance of each second inductance element 720, and fourth inductance elements 790 each have an inductance that is twice the inductance of each second inductance element 730. Other elements such as blocking capacitors, power supply voltages, bias voltage connections, etc. are omitted from the simplified schematic diagram of FIG. 7 for ease of illustration.

In TWA 700, first and third inductance elements 720 and 780 form a synthetic gate line 725 between input port 710 and input termination 750. Similarly, second and fourth inductance elements 730 and 790 form a synthetic drain line 775 between output termination 760 and output port 770. In one embodiment, input and output terminations are each 50 ohms, and the characteristic impedances of the artificial gate transmission line and the artificial drain transmission line of TWA 700 are also each 50 ohms.

In TWA 700, common drain driven cascode transistor circuits 740 are connected between synthetic gate line 725 and synthetic drain line 775.

Furthermore, TWA 700 has n (e.g., n=4) stages 715 between input port 710 and output port 770. As shown in FIG. 7, each stage 715 includes: an input path 717 including a first input path terminal 717a and a second input path terminal 717b; an output path 719 including a first output path terminal 719a and a second output path terminal 719b; and a common drain driven cascode transistor circuit 740 connected between input path 717 and output path 719.

Figure 8:
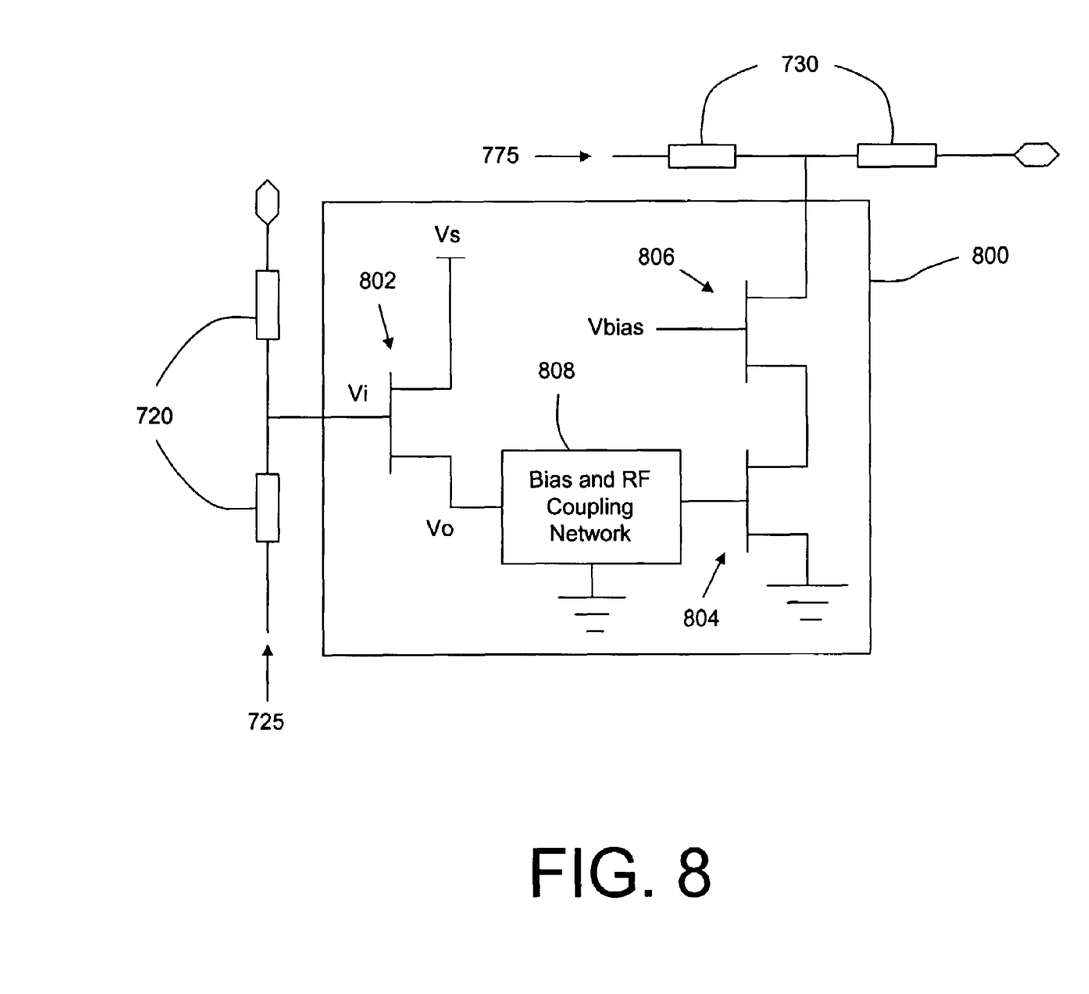
FIG. 8 shows one embodiment of a common drain driven cascode transistor circuit

FIG. 8 shows one embodiment of a common drain driven cascode transistor circuit 800 that may be employed as common drain driven cascode transistor circuit 740 in TWA 700. Common drain driven cascode transistor circuit 800 includes a first transistor 802, a second transistor 804, a third transistor 806, and a bias and RF coupling circuit 808. First transistor 802 has a gate connected to synthetic gate line 725 of TWA 700. First transistor 802 also has a drain connected to a supply voltage Vs, and a source connected to bias and RF coupling circuit 808. Bias and RF coupling circuit 808 connects the source of first transistor 802 to the gate of second transistor 804. The source of second transistor 804 is connected to a second supply voltage (e.g., ground). The drain of second transistor 804 is connected to the source of third transistor 806. The gate of third transistor 806 is connected to a bias voltage, Vbias, and the drain of third transistor 806 is connected to the synthetic drain line 775 of TWA 700. Also, bias and RF coupling circuit 808 connects the source of first transistor 802 to the second supply voltage (e.g., ground), providing a source load for first transistor 802. Beneficially, first, second, and third transistors 802, 804 and 806 are enhancement mode field effect transistors (FETs).

An explanation of the operation of common drain driven cascode transistor circuit 800 is now provided. Second and third transistors 804 and 806 are connected in a cascode arrangement. First transistor 802 is connected in a common drain configuration, and it feeds the gate of second transistor 804. Bias and RF coupling circuit 808 is used in general to divide the DC voltage at the output of transistor 802 and apply the divided DC voltage to transistor 804 in those cases where second transistor 804 cannot handle all of the DC voltage from first transistor 802, and also to couple the RF voltage, Vo, from the output of first transistor 802 to second transistor 804. First transistor 802 acts as a unity gain impedance transformer, having a high input impedance and a low output impedance. The reactive part of the input impedance of first transistor 802 can be approximated by:

$$C_{eff} = (1 - Vo/Vi) * C_{gs1}. \quad (6)$$

Since first transistor 802 is connected in a common drain arrangement, then $Vo \approx Vi$, such that $C_{eff} \rightarrow 0$. Furthermore, the capacitance of first transistor 802 is in series with the gate-source capacitance of second transistor 804, $C_{gs2}$. So the total capacitance $C_{gs}$ of common drain driven cascode transistor circuit 800 seen by synthetic gate line 725 is:

$$C_{gs} \approx C_{eff} \rightarrow 0. \quad (7)$$

From the above, it can be seen that, all other things being equal, the capacitance $C_G$ of the artificial gate transmission line of TWA 700 including the common drain driven cascode transistor circuit 740 is substantially reduced compared to TWA 100 of FIG. 1. So the cutoff frequency Fc(gate) of artificial gate transmission line 725 is increased with respect to artificial gate transmission line 125 of TWA 100. Therefore, all other things being equal, the bandwidth of TWA 700 is increased compared to TWA 100. Accordingly, TWA 700 may use transistors having a larger gate periphery to provide increased gain and larger output power, while maintaining a large operating bandwidth.

Variations of common drain driven cascode transistor circuit 800 of FIG. 8 may be employed in FIG. 7. For example, instead of connecting the source of second transistor 804 directly to ground, a parallel resistor/capacitor (RC) circuit (such the circuit 410 of FIG. 4) may connect the source of second transistor 804 to a second supply voltage, which may or may not be ground. Indeed, the source of second transistor 804 may be connected to the first supply voltage, Vs, either directly or through a parallel resistor/capacitor (RC) circuit. Various such modifications of the common drain driven cascode transistor circuit are possible.

While example embodiments are disclosed herein, one of ordinary skill in the art appreciates that many variations that are in accordance with the present teachings are possible and remain within the scope of the appended claims. The embodiments therefore are not to be restricted except within the scope of the appended claims.

The invention claimed is:

1. A traveling wave amplifier, comprising:
   an input port adapted to receive a signal to be amplified;
   an output port adapted to output an amplified signal; and
   a plurality of stages provided between the input port and the output port, each stage including:
      an input path including a first input oath terminal and a second input path terminal;
      an output path including a first output path terminal and a second output path terminal;
      a first field effect transistor having a gate connected to the input path between the first input path terminal and the second input path terminal, a drain connected to a supply voltage, and a source;
      a second field effect transistor having a gate connected to the source of the first transistor, a source connected to a second supply voltage, and a drain; and
      a third field effect transistor having a pate connected to a bias voltage, a source connected to the drain of the second transistor, and a drain connected to the output path between the first output path terminal and the second output path terminal;
      a parallel resistor/capacitor (RC) circuit connecting the source of the second transistor to the second supply voltage.

2. The traveling wave amplifier of claim 1, wherein each stage further comprises a bias and RF coupling circuit connecting the source of the first transistor and gate of the second transistor, and also connecting the source of the first transistor to the second supply voltage.

3. The traveling wave amplifier of claim 1, wherein the second supply voltage is ground.

4. The traveling wave amplifier of claim 1, wherein the second supply voltage is the same as the first supply voltage.

5. A traveling wave amplifier, comprising:
- an input port adapted to receive a signal to be amplified;
- an output port adapted to output an amplified signal;
- an input termination;
- an output termination;
- a synthetic gate line extending between the input port and the input termination;
- a synthetic drain line extending between the output termination and the output port; and
- a plurality of common drain driven cascode transistor circuits, each common drain driven cascode transistor circuit comprising:
  - a first transistor having a gate connected to the synthetic gate line, a drain connected to a supply voltage, and a source;
  - a second transistor having a gate connected to the source of the first transistor, a source connected to a second supply voltage, and a drain;
  - a third transistor having a gate connected to a bias voltage, a source connected to the drain of the second transistor, and a drain connected to the synthetic drain line; and
  - a parallel resistor/capacitor (RC) circuit connecting the source of the second transistor to the second supply voltage.

6. The traveling wave amplifier of claim 5, wherein the input termination has a same impedance as a characteristic impedance of a transmission line comprising the synthetic gate line and a plurality of capacitors to ground each having a capacitance the same as an effective input capacitance of the common drain driven cascode transistor circuit.

7. The traveling wave amplifier of claim 5, wherein the output termination has a same impedance as a characteristic impedance of a transmission line comprising the synthetic drain line and a plurality of capacitors to ground each having a capacitance the same as an effective output capacitance of the common drain driven cascode transistor circuit.

8. The traveling wave amplifier of claim 5, wherein each common drain driven cascode transistor circuit further comprises a bias and RE coupling circuit connecting the source of the first transistor and gate of the second transistor, and also connecting the source of the first transistor to the second supply voltage.

9. The traveling wave amplifier of claim 5, wherein the second supply voltage is ground.

10. The traveling wave amplifier of claim 5, wherein the second supply voltage is the same as the first supply voltage.

11. A traveling wave amplifier, comprising a synthetic gate line, a synthetic drain line and a plurality of common drain driven cascode transistor circuits each connected between the synthetic oate line and the synthetic drain line, wherein each common drain cascode transistor circuit comprises:
- a first transistor having a gate connected to the synthetic gate line, a drain connected to a supply voltage, and a source;
- a second transistor having a gate connected to the source of the first transistor, a source, and a drain;
- a third transistor having a gate connected to a bias voltage, a source connected to the drain of the second transistor, and a drain connected to the synthetic drain line; and
- a parallel resistor/capacitor (RC) circuit having a first end connected to the source of the second transistor and a second end connected to a second supply voltage.

* * * * *

UNITED STATES PATENT AND TRADEMARK OFFICE
CERTIFICATE OF CORRECTION

PATENT NO.         : 7,525,385 B2
APPLICATION NO.    : 11/589177
DATED              : April 28, 2009
INVENTOR(S)        : Sushil Kumar It is certified that error appears in the above-identified patent and that said Letters Patent is hereby corrected as shown below:

Column 6, Line 44 (approx.), Claim 1, delete "oath" and insert --path--.

Column 6, Line 55, Claim 1, delete "pate" and insert --gate--.

Column 6, Line 59, Claim 1, after "terminal;" insert --and--.

Column 7, Line 23, Claim 5, delete "aate" and insert --gate--.

Column 8, Line 9, Claim 8, delete "RE" and insert --RF--.

Column 8, Line 19 (approx.), Claim 11, delete "cascade" and insert --cascode--.

Column 8, Line 20 (approx.), Claim 11, delete "oate" and insert --gate--.

Signed and Sealed this
Twenty-eighth Day of December, 2010

David J. Kappos
*Director of the United States Patent and Trademark Office*